(12) United States Patent
Rho

(10) Patent No.: US 7,053,679 B2
(45) Date of Patent: May 30, 2006

(54) OUTPUT DRIVER FOR CONTROLLING SLEW RATE IN A SEMICONDUCTOR DEVICE

(75) Inventor: Kwang Myoung Rho, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/849,288

(22) Filed: May 19, 2004

(65) Prior Publication Data
US 2005/0127956 A1 Jun. 16, 2005

(30) Foreign Application Priority Data
Dec. 15, 2003 (KR) .................. 10-2003-0091419

(51) Int. Cl.
*H03K 3/00* (2006.01)
(52) U.S. Cl. .................. 327/108; 327/170; 326/83
(58) Field of Classification Search ........ 327/108–112, 327/170, 436, 437; 326/80–83
See application file for complete search history.

(56) References Cited

U.S. PATENT DOCUMENTS
6,304,120 B1 * 10/2001 Taito .................. 327/170

FOREIGN PATENT DOCUMENTS
KR 026231 4/1999

* cited by examiner

*Primary Examiner*—Kenneth B. Wells
(74) *Attorney, Agent, or Firm*—Ladas & Parry LLP

(57) ABSTRACT

Disclosed is an output driver for a semiconductor device with an improved slew rate. The output driver comprises a first pre-driver receiving a first signal so as to output a second signal in which a slew rate is controlled, a second pre-driver receiving a third signal so as to output a fourth signal in which a slew rate is controlled, and a pull-up transistor and a pull-down transistor connected in series between a power supply voltage and a ground voltage. The pull-up transistor is turned on and/or off by the second signal, and the pull-down transistor is turned on and/or off by the fourth signal.

18 Claims, 5 Drawing Sheets

OUTPUT DRIVER FOR CONTROLLING SLEW RATE IN A SEMICONDUCTOR DEVICE

BACKGROUND OF THE INVENTION

1. Field of the Invention

The present invention relates to an output driver for a semiconductor device, and more particularly to an output driver for a semiconductor device with an improved slew rate characteristic.

2. Description of the Prior Art

Semiconductor devices such as DRAMs need an output driver having superior driving capability in order to transmit/receive data to/from exterior systems such as chip controllers. Generally, a slew rate of an output driver having superior driving capability has a lower limit value. That is, an output driver should be designed to have a slew rate exceeding the lower limit value regardless of variation of the process-voltage-temperature (hereinafter, referred to as "PVT").

However, when a slew rate exceeds a predetermined level, the following problems may occur.

First, when a slew rate of an output driver is too high, amount of an instantaneous current consumed by the output driver may increase. Therefore, a driving voltage decreases due to inductance and resistance of a power line, and a ringing phenomenon may occur.

Secondly, as a slew rate increases, a reflective wave effect may increase due to incomplete termination in a transmission line connecting a semiconductor device, such as a DRAM, to an exterior system, thereby deteriorating signal integrity.

Because of these problems, it is also important that a slew rate of an output driver does not exceed a predetermined value. Therefore, it is preferred to design an output driver in such a manner that a slew rate has a value between an upper limit value and a lower limit value by considering the variation of the PVT.

FIG. 1 is a circuit diagram of a conventional output driver for maintaining variation of a slew rate, which is caused by variation of PVT, within a predetermined range.

Referring to FIG. 1, when a '/up' signal is changed into a low level, a pre-driver 100 turns on a pull-up transistor 11, and when a 'dn' signal is turned to a high level, a pre-driver 110 turns on a pull-down transistor 12. Transistors 13 and 14 are connected in series between the pull-up transistor 11 and the pull-down transistor 12 and function as a factor of decreasing the value of the slew rate in the output driver. That is, with the prior art, it can be understood that resistors are provided to the output end of the output driver so as to prevent the slew rate from exceeding a predetermined value.

However, the prior art shown in FIG. 1 still has a problem in that the slew rate becomes unstable when the resistance values of the resistors are varied according to variation of the PVT.

SUMMARY OF THE INVENTION

Accordingly, the present invention has been made to solve the above-mentioned problems occurring in the prior art, and an object of the present invention is to provide a method in which a pre-driver previously controls a slew rate of a signal.

In order to accomplish this object, there is provided an output driver for a semiconductor device, the output driver comprising: a first pre-driver receiving a first signal so as to output a second signal in which a slew rate is controlled; a second pre-driver receiving a third signal so as to output a fourth signal in which a slew rate is controlled; and a pull-up transistor and a pull-down transistor connected in series between a power supply voltage and a ground voltage, wherein the pull-up transistor is turned on and/or off by the second signal, and the pull-down transistor is turned on and/or off by the fourth signal.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
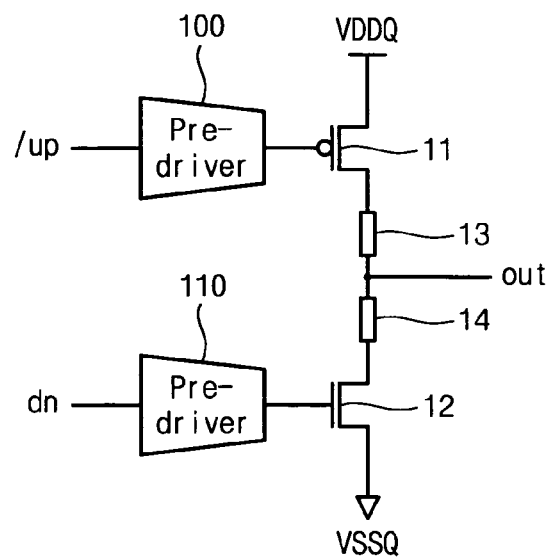
FIG. 1 is a circuit diagram of a conventional output driver for maintaining variation of a slew rate, which is caused by variation of the PVT, within a predetermined range.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
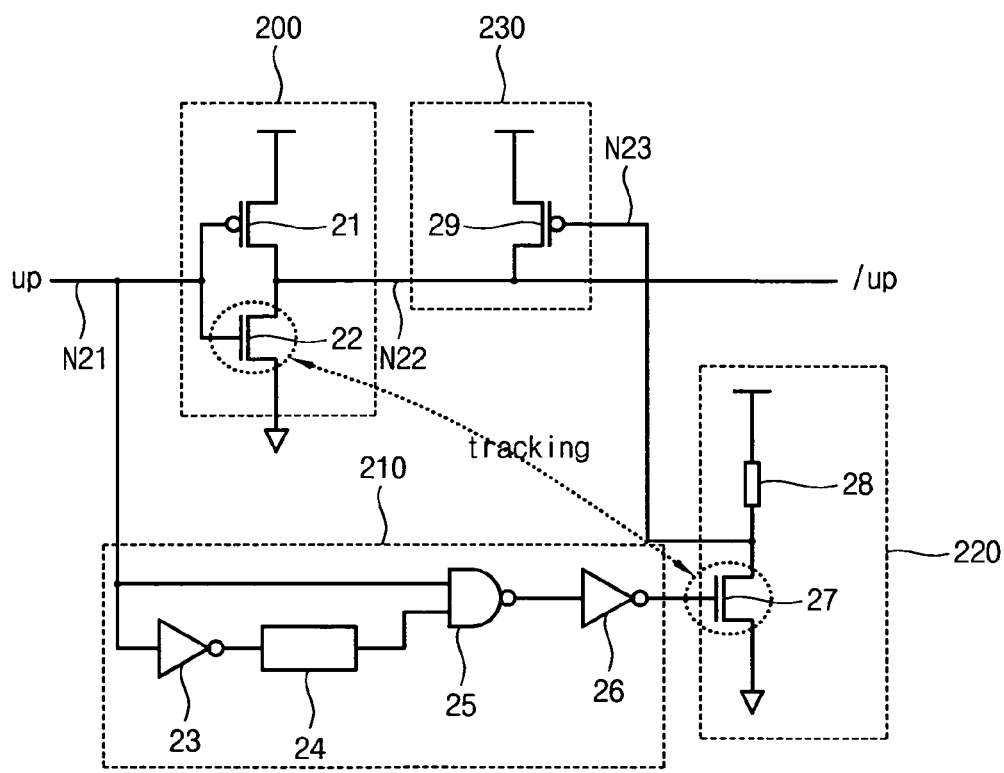
FIG. 2 is a circuit diagram showing an example of circuits for restricting variation of a slew rate according to the present invention, in which a pre-driver circuit for restricting variation of a falling slew rate is illustrated.

FIG. 2 is a circuit diagram showing an example of circuits for restricting variation of a slew rate according to the present invention, in which a pre-driver circuit for restricting variation of a falling slew rate is illustrated.

Figure 4:
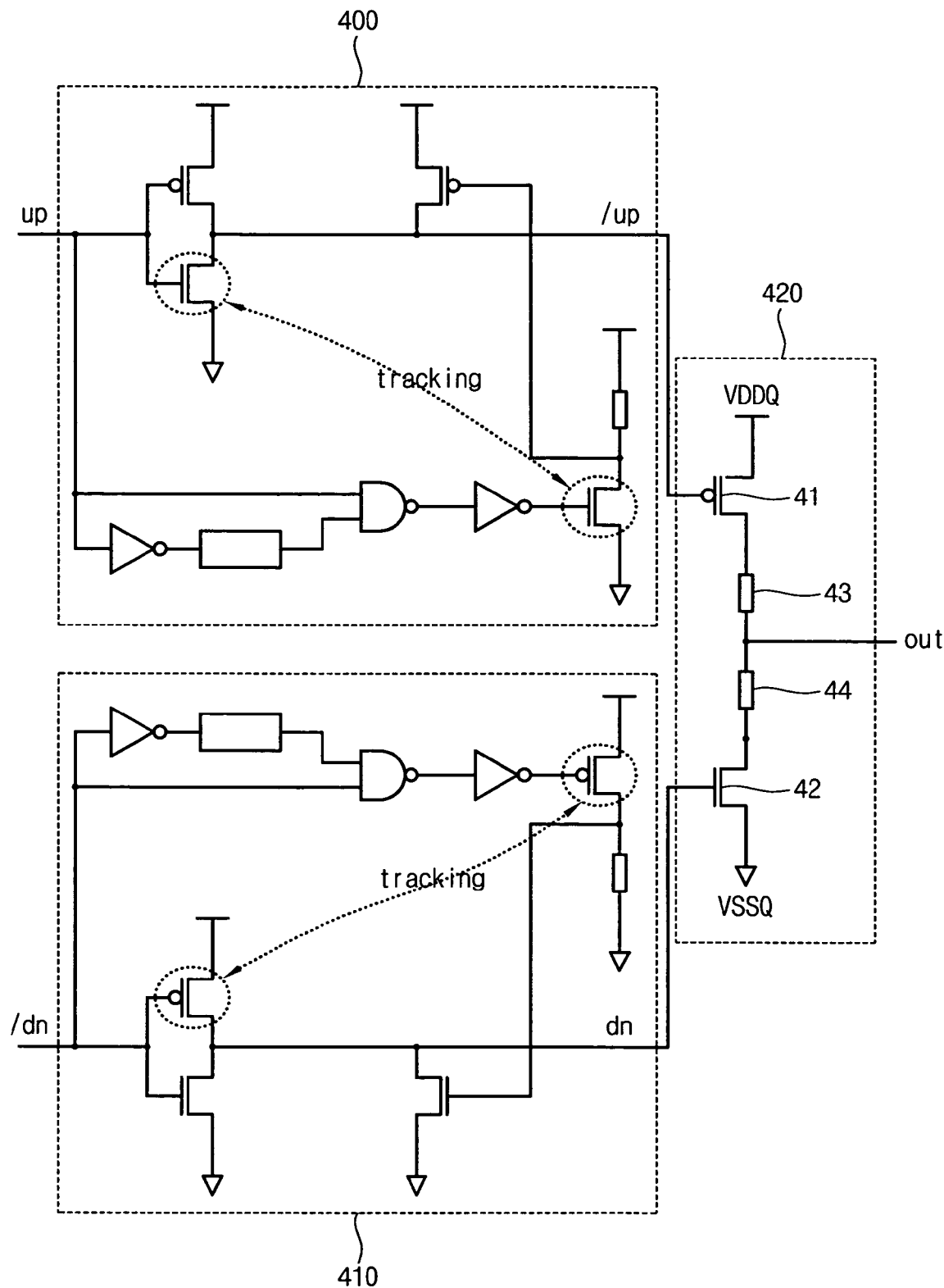
FIG. 4 is a circuit diagram of an output driver including the pre-drivers shown in FIGS. 2 and 3 according to a first embodiment of the present invention.

The pre-driver of FIG. 2 is a circuit for controlling an operation of a pull-up transistor 41 in an output driver shown in FIG. 4.

A pull-up pre-driver shown in FIG. 2 includes a CMOS inverter 200 for receiving a first signal (up), a pulse generating circuit 210 for receiving the first signal (up) and outputting a pulse signal having a constant width, a first control section 220 for receiving the pulse signal outputted from the pulse generating circuit 210, and a second control section 230 turned on and/or off according to a control signal outputted from the first control section 220.

In FIG. 2, the second control section 230 is positioned between a power supply voltage and an output end of the CMOS inverter 200, and a second signal (/up) represents an output signal at the output end of the CMOS inverter 200. The first and second control sections 220 and 230 are sequentially enabled by the pulse signal generated from the pulse generating circuit 210. When the second control section 230 is enabled, the power supply voltage is supplied to the output end of the CMOS inverter 200. The first control section 220 includes a resistance component 28 and an NMOS transistor 27 which are connected in series between the power supply voltage and a ground voltage. The CMOS inverter 200 is positioned between the power supply voltage and the ground voltage. An NMOS transistor 22 in the CMOS inverter has a PVT variation property similar to that of the NMOS transistor 27 in the first control section 220. In FIG. 2, the second control section 230 includes a PMOS transistor 29.

Hereinafter, an operation of the pull-up pre-driver shown in FIG. 2 will be described.

The pull-up pre-driver circuit shown in FIG. 2 corresponds to a pull-up pre-driver circuit 400 shown in FIG. 4, which is a circuit for driving a pull-up transistor 41 shown in FIG. 4.

Referring to FIG. 2, when a signal (up) applied to the CMOS inverter 200 is shifted to a high level, the NMOS transistor 22 included in the CMOS inverter 200 is activated. Therefore, the output signal (/up) of the CMOS inverter 200 is shifted to a low level. Accordingly, the pull-up transistor 41 shown in FIG. 4 is driven to transmit a high-level signal to an output end.

With such an operation, it can be understood that an operation property of the NMOS transistor 22 shown in FIG. 2 directly influences a rising slew rate of the output driver shown in FIG. 4. That is, the slew rate of the NMOS transistor 22 shown in FIG. 2 influences the slew rate of the pull-up transistor 41 shown in FIG. 4.

The present invention proposes a method of controlling the slew rate of the NMOS transistor 22 by providing the pulse generating circuit 210 and the first and second control sections 220 and 230.

The basic concept of the present invention is to sense signal transition when the signal (up) is shifted into a high level, and then, to decrease a slew rate of the signal (/up) by turning on the second control section 230.

To this end, the pulse generating circuit 210 receives the signal (up) and generates a pulse signal having a predetermined width. The pulse generating circuit 210 includes an inverter 23, a delay circuit 24, an NAND gate 25, and an inverter 26. The inverter 23 and the delay circuit 24 are connected in series. The output end of the delay circuit 24 is connected to a first input end of the NAND gate 25. The signal (up) is supplied to a second input end of the NAND gate 25 and the inverter 23. Accordingly, when the level of the signal (up) is shifted, the pulse generating circuit 210 senses the shift and generates a pulse signal having a predetermined width.

The first control section 220 includes the resistance component 28 and the NMOS transistor 27 which are connected in series between the power supply voltage and the ground voltage. The output end of the pulse generating circuit 210 is connected to the gate of the NMOS transistor 27. Therefore, while the pulse signal is turned to a high level, the NMOS transistor 27 is turned on.

The second control section 230 includes the PMOS transistor 29. The gate of the PMOS transistor 29 is connected to the drain of the NMOS transistor 27 of the first control section 220 through line N23. While the NMOS transistor 27 is turned on, the PMOS transistor 29 is turned on. When the PMOS transistor 29 is turned on, the power supply voltage is transferred to node N22 which is the output end of the CMOS inverter 200. Therefore, an effect of decreasing a slew rate outputted from the CMOS inverter 200 can be obtained.

Hereinafter, an operation of the above-mentioned circuit according to the present invention will be described in more detail.

If current driving capability of the NMOS transistor 22 increases due to variation of a process, a voltage, or temperature, the slew rate of an output signal of the pull-up pre-driver (that is, the output signal of the CMOS inverter) increases. That is, when a signal (up) shifted from a low level to a high level is applied to the input end of the CMOS inverter, the slew rate of the output signal of the CMOS inverter shifted from a high level to a low level increases under the influence of the NMOS transistor 22, which has superior driving capability.

When the driving capability of NMOS transistor 22 increases due to variation of the PVT, the driving capability of the NMOS transistor 27 having a PVT variation property similar to that the NMOS transistor 22 also increases. Accordingly, an electric potential of node N23 is shifted to the low level within a short period of time. As a result, the PMOS transistor 29 is turned on within a short period of time, so that the PMOS transistor 29 can transfer the power supply voltage to the output end of the CMOS inverter 200. Therefore, it is possible to obtain an effect of restricting increase of the falling slew rate of the output signal of the CMOS inverter shifted from a high level to a low level.

A pulse signal (high-level pulse signal) outputted from the pulse generating circuit 210 is generated at a rising edge point of the input signal (up) and is maintained during a predetermined period of time. It is possible to adjust the width of the pulse by controlling a delay time of the delay circuit 24 in the pulse generating circuit 210.

Figure 3:
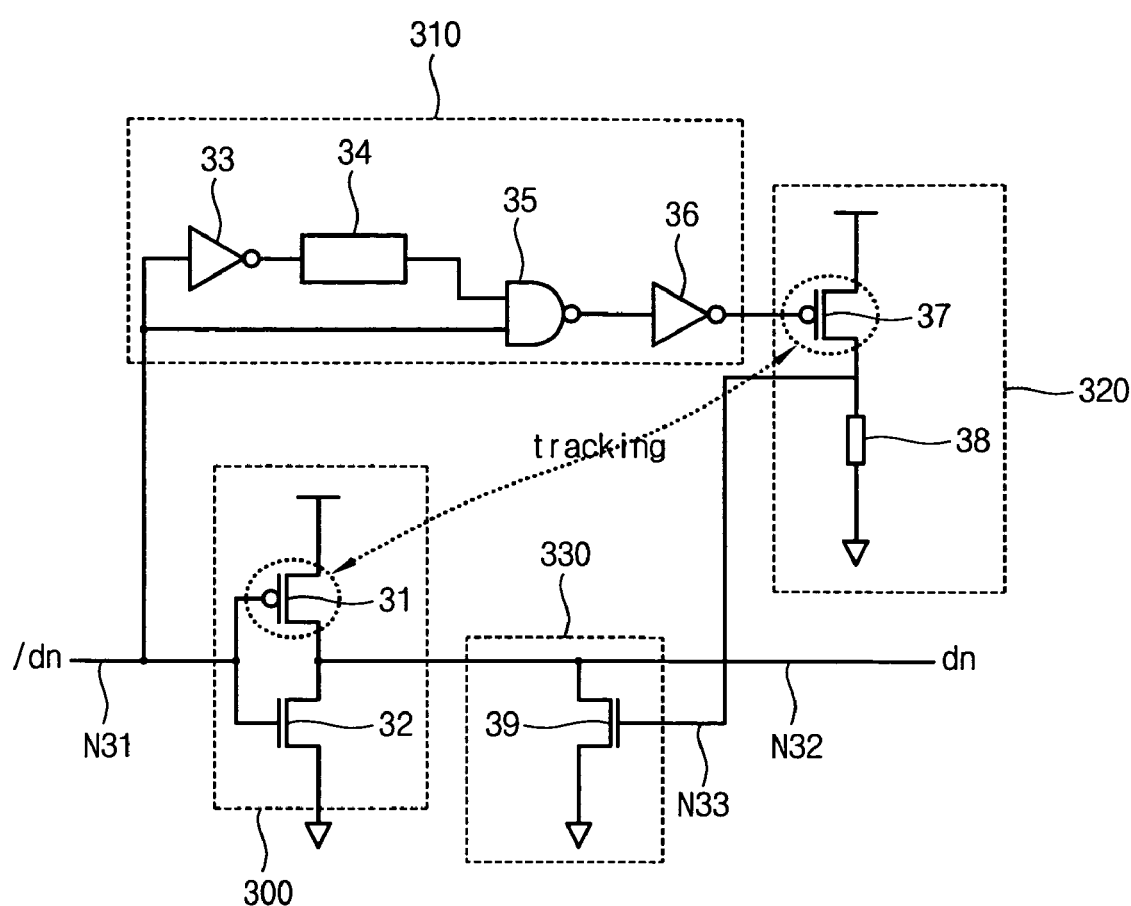
FIG. 3 is a circuit diagram showing an example of circuits for restricting variation of a slew rate according to the present invention, in which a pre-driver circuit for restricting variation of a rising slew rate is illustrated.

FIG. 3 FIG. 2 is a circuit diagram showing an example of circuits for restricting variation of a slew rate according to the present invention, in which a pre-driver circuit for restricting variation of a rising slew rate is illustrated.

The pre-driver of FIG. 3 is a circuit for controlling an operation of a pull-down transistor 42 in the output driver shown in FIG. 4.

The operation of the pull-down pre-driver shown in FIG. 3 is practically identical to the operation of the pull-up pre-driver shown in FIG. 2. However, there is one difference in that a rising slew rate of an output signal of the pull-down pre-driver shifted from a low level to a high level is suppressed when an input signal (/dn) is shifted from a high level to a low level in the circuit shown in FIG. 3.

The pull-down pre-driver shown in FIG. 3 includes a CMOS inverter 300 for receiving an input signal (/dn), a pulse generating circuit 310 for receiving the input signal (/dn) and outputting a pulse signal having a constant width, a first control section 320 for receiving the pulse signal outputted from the pulse generating circuit 310, and a second control section 330 turned on and/or off according to a control signal outputted from the first control section 320.

In FIG. 3, the second control section 330 is positioned between an output end of the CMOS inverter 300 and the ground voltage, and an output signal (dn) represents an output signal at the output end of the CMOS inverter 300. The first and second control sections 320 and 330 are sequentially enabled by the pulse signal generated from the pulse generating circuit 310. When the second control section 330 is enabled, the ground voltage is supplied to the output end of the CMOS inverter 300. The first control section 320 includes a resistance component 38 and a PMOS transistor 37 which are connected in series between the power supply voltage and the ground voltage. The CMOS inverter 300 is positioned between the power supply voltage and the ground voltage. A PMOS transistor 31 in the CMOS inverter has a PVT variation property similar to that of the PMOS transistor 37 in the first control section 320. In FIG. 3, the second control section 330 includes an NMOS transistor 39.

Hereinafter, an operation of the pull-down pre-driver shown in FIG. 3 will be described.

The pull-down pre-driver circuit shown in FIG. 3 corresponds to a pull-down pre-driver circuit 410 shown in FIG. 4, which is a circuit for driving a pull-down transistor 42 shown in FIG. 4.

Referring to FIG. 3, when an input signal (/dn) applied to the CMOS inverter 300 is shifted from a high level to a low level, the PMOS transistor 31 included in the CMOS inverter 300 is activated. Therefore, an output signal (dn) of the CMOS inverter 300 is shifted from a low level to a high level. Accordingly, the pull-down transistor 42 shown in FIG. 4 is driven to transmit a low-level signal to an output end.

With such an operation, it can be understood that an operation property of the PMOS transistor 31 shown in FIG. 3 directly influences a falling slew rate of the output signal of the output driver shown in FIG. 4. That is, the slew rate of the PMOS transistor 31 shown in FIG. 3 influences the slew rate of the pull-down transistor 42 shown in FIG. 4.

The present invention proposes a method of controlling the slew rate of the PMOS transistor 31 by providing the pulse generating circuit 310 and the first and second control sections 320 and 330.

The basic concept of the present invention is to sense signal transition when the signal (/dn) is shifted from a high level into a low level, and then, to decrease a slew rate of the output signal (dn) by turning on the second control section 330.

To this end, the pulse generating circuit 310 receives the input signal (/dn) and generates a pulse signal having a predetermined width. The pulse generating circuit 310 includes an inverter 33, a delay circuit 34, an NOR gate 35, and an inverter 36. The inverter 33 and the delay circuit 34 are connected in series. The output end of the delay circuit 34 is connected to a first input end of the NOR gate 35. The input signal (/dn) is applied to a second input end of the NOR gate 35 and the inverter 33. Accordingly, when the level of the input signal (/dn) is shifted, the pulse generating circuit 310 senses the shift and generates a pulse signal having a predetermined width.

The first control section 320 includes the resistance component 38 and the PMOS transistor 37 which are connected in series between the power supply voltage and the ground voltage. The output end of the pulse generating circuit 310 is connected to the gate of the PMOS transistor 37. Therefore, while the pulse signal is turned to a low level, the PMOS transistor 37 is turned on.

The second control section 330 includes the NMOS transistor 39. The gate of the NMOS transistor 39 is connected to the drain of the PMOS transistor 37 of the first control section 320 through line N33. While the PMOS transistor 37 is turned on, the NMOS transistor 39 is turned on. When the NMOS transistor 39 is turned on, the ground voltage is supplied to node N32 which is the output end of the CMOS inverter 300. Therefore, an effect of decreasing a slew rate outputted from the CMOS inverter 300 can be obtained.

Hereinafter, an operation of the above-mentioned circuit according to the present invention will be described in more detail.

If current driving capability of the PMOS transistor 31 increases due to variation of a process, a voltage, or temperature, the slew rate of an output signal of the pull-down pre-driver (that is, the output signal of the CMOS inverter) increases. That is, when a signal (/dn) shifted from a high level to a low level is applied to the input end of the CMOS inverter, the slew rate of the output signal of the CMOS inverter 300 shifted from a low level to a high level increases under the influence of the PMOS transistor 31 having superior driving capability.

When the driving capability of PMOS transistor 31 increases due to variation of the PVT, the driving capability of the PMOS transistor 37 having a PVT variation property similar to that of the PMOS transistor 31 also increases. Accordingly, an electric potential of node N33 is shifted to the high level within a short period of time. As a result, the NMOS transistor 39 is turned on within a short period of time, so that the ground voltage can be supplied to the output end of the CMOS inverter 300. Therefore, it is possible to obtain an effect of restricting increase of the rising slew rate of the output signal of the CMOS inverter 300 shifted from a low level to a high level.

A pulse signal (low-level pulse signal) outputted from the pulse generating circuit 310 is generated at a falling edge point of the input signal (/dn) and is maintained during a predetermined period of time. It is possible to adjust the width of the pulse by controlling a delay time of the delay circuit 34 in the pulse generating circuit 310.

FIG. 4 is a circuit diagram of an output driver including the pre-drivers shown in FIGS. 2 and 3 according to a first embodiment of the present invention.

The output driver of FIG. 4 includes the pull-up pre-driver 400, the pull-down pre-driver 410, and a driving section 420.

Since the operations of the pull-up pre-driver 400 and the pull-down pre-driver 410 have been already described with reference to FIGS. 2 and 3, they will not be further described below.

The driving section 420 includes a pull-up transistor 41, resistors 43 and 44, and a pull-down transistor 42, which are connected in series between a power supply voltage VDDQ and a ground voltage VSSQ. Herein, the resistors 43 and 44 are selectively included. That is, the driving section 420 includes only the pull-up transistor 41 and the pull-down transistor 42 which are connected between the power supply voltage VDDQ and the ground voltage VSSQ, in series.

With the operation of the circuit shown in FIG. 4, it is possible to control a upper limit value of a slew rate of a signal outputted from the driving section 420 by decreasing slew rates of the signals (/up) and (dn) outputted from the pull-up pre-driver 400 and the pull-down pre-driver 410.

Figure 5:
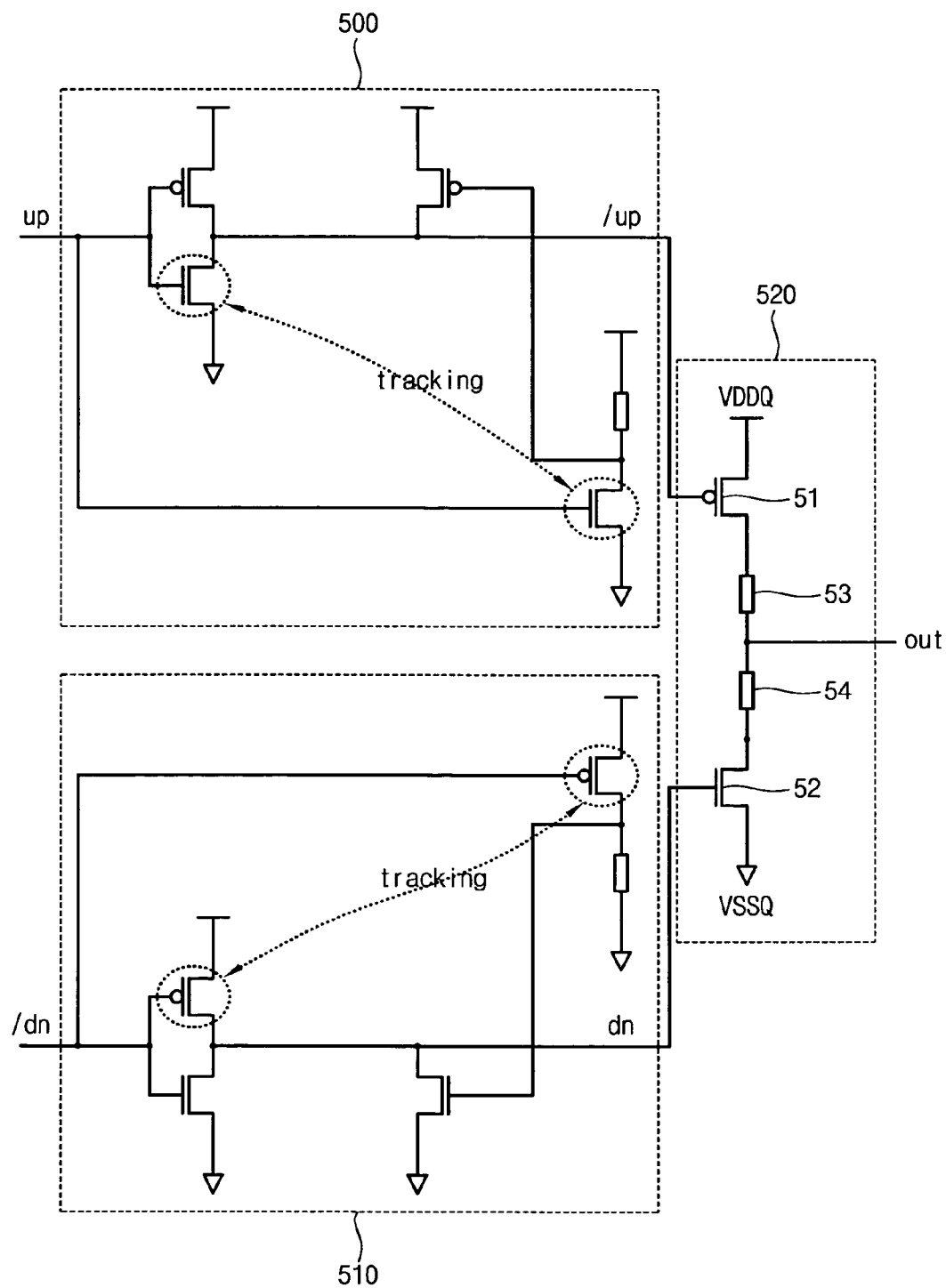
FIG. 5 is a circuit diagram of an output driver including a pre-driver circuit for controlling a slew rate according to a second embodiment of the present invention.

FIG. 5 is a circuit diagram of an output driver including a pre-driver circuit for controlling a slew rate according to a second embodiment of the present invention.

The output driver of FIG. 5 includes the pull-up pre-driver 500, the pull-down pre-driver 510, and a driving section 520.

The driving section 520 includes a pull-up transistor 51, resistors 53 and 54, and a pull-down transistor 52, which are connected in series between a power supply voltage VDDQ and a ground voltage VSSQ. Herein, the resistors 53 and 54 are selectively included. That is, the driving section 520 may include only the pull-up transistor 51 and the pull-down transistor 52 which are connected in series between the power supply voltage VDDQ and the ground voltage VSSQ.

In the output driver shown in FIG. 5, the constructions of the pull-up pre-driver 500 and the pull-down pre-driver 510 are practically identical to those of the output driver shown in FIG. 4, except for a little structural difference.

As shown in FIG. 5, the pull-up pre-driver 500 and the pull-down pre-driver 510 do not employ any pulse generating circuit. In this case, it can be understood that the capability for controlling the slew rate becomes much greater as compared with the circuit shown in FIG. 4. Therefore, it is preferred that the circuit shown in FIG. 5 is used in a case in which the slew rate is very large.

Figure 6:
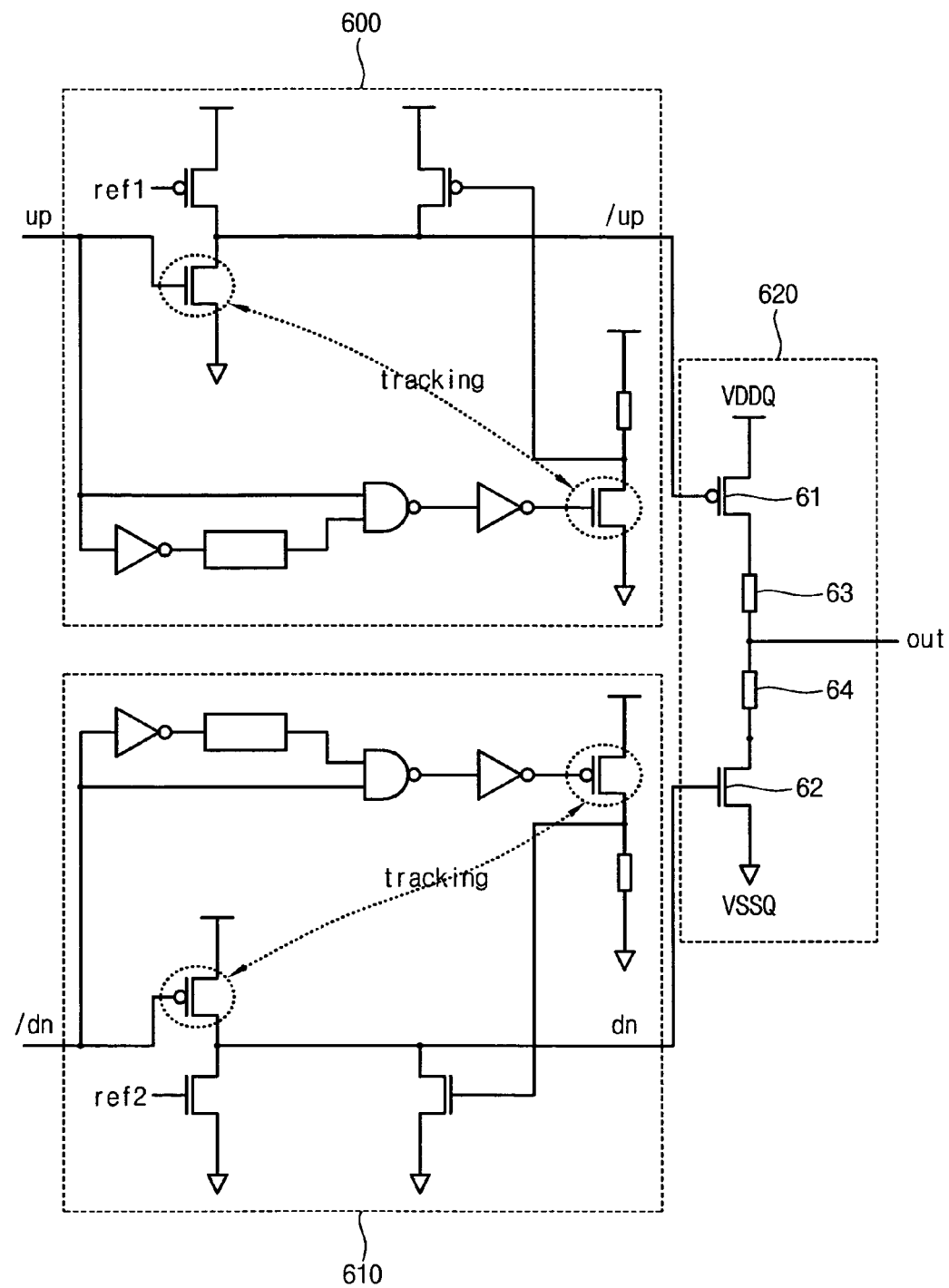
FIG. 6 is a circuit diagram of an output driver including a pre-driver circuit for controlling a slew rate according to a third embodiment of the present invention.

FIG. 6 is a circuit diagram of an output driver including a pre-driver circuit for controlling a slew rate according to a third embodiment of the present invention.

The output driver of FIG. 6 includes the pull-up pre-driver 600, the pull-down pre-driver 610, and a driving section 620.

The driving section 620 includes a pull-up transistor 61, resistors 63 and 64, and a pull-down transistor 62, which are connected in series between a power supply voltage VDDQ and a ground voltage VSSQ. Herein, the resistors 63 and 64 are selectively included. That is, the driving section 620 may include only the pull-up transistor 61 and the pull-down transistor 62 which are connected in series between the power supply voltage VDDQ and the ground voltage VSSQ.

In the output driver shown in FIG. 6, the constructions of the pull-up pre-driver 600 and the pull-down pre-driver 610 are practically identical to the circuit shown in FIG. 4, except for a little structural difference.

As shown in FIG. 6, each of the pull-up pre-driver 600 and the pull-down pre-driver 610 includes a PMOS transistor and an NMOS transistor which are dependently operated, instead of a CMOS. The operation of the circuit shown in FIG. 6 is practically identical to the operation of the circuit shown in FIG. 4.

When an output driver according to the present invention is used, it is possible to control the slew rate of an output signal within a proper range. Consequently, the signal integrity (SI) characteristic of a signal outputted through an output driver can be improved.

Also, when an output driver according to the present invention is used, it is possible to control a slew rate variation which may be caused by change of device property occurring due to variation of the PVT.

According to the present invention described above, a method of controlling a slew rate in a pre-driver is provided, so that the signal integrity (SI) characteristic of an output signal is improved and a stable signal can be transferred to an exterior system.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An output driver for a semiconductor device, the output driver comprising:
   a first pre-driver receiving a first signal so as to output a second signal in which a slew rate is controlled, wherein the first pre-driver comprises:
      a CMOS inverter for receiving the first signal,
      a pulse generating circuit for receiving the first signal to output a pulse signal having a constant width,
      a first control section for receiving the pulse signal outputted from the pulse generating circuit, and
      a second control section which is turned on and/or off by a control signal outputted from the first control section,
         wherein the second control section is positioned between a power supply voltage and an output end of the CMOS inverter,
         wherein the second signal represents an output signal outputted through the output end of the CMOS inverter,
      wherein the first and the second control section are sequentially enabled by the pulse signal generated from the pulse generating circuit, and
      wherein the power supply voltage is supplied to the output end when the second control section is enabled,
   a second pre-driver receiving a third signal so as to output a fourth signal in which a slew rate is controlled; and
   a pull-up transistor and a pull-down transistor connected in series between a power supply voltage and a ground voltage,
   wherein the pull-up transistor is turned on and/or off by the second signal, and the pull-down transistor is turned on and/or off by the fourth signal.

2. The output driver as claimed in claim 1, wherein the second control section is enabled only while the pulse signal is enabled.

3. The output driver as claimed in claim 1, wherein the first control section comprises at least one resistance component and at least one transistor connected in series between the power supply voltage and the ground voltage, and the transistor of the first control section is turned on to enable the second control section while the pulse signal is enabled.

4. The output driver as claimed in claim 3, wherein the CMOS inverter is positioned between the power supply voltage and the ground voltage, and an NMOS transistor of the CMOS inverter has a PVT (process, voltage, and temperature) variation property similar to that of the transistor of the first control section.

5. The output driver as claimed in claim 4, wherein the transistor of the first control section is an NMOS transistor and the second control section includes a PMOS transistor.

6. The output driver as claimed in claim 2, wherein a first and a second resistance component are connected between the pull-up transistor and the pull-down transistor.

7. An output driver for a semiconductor device, the output driver comprising:
   a first pre-driver receiving a first signal so as to output a second signal in which a slew rate is controlled, wherein the first pre-driver comprises:
      a CMOS inverter for receiving the first signal,
      a first control section for receiving the first signal, and
      a second control section which is turned on and/or off by a control signal outputted from the first control section,
         wherein the second control section is positioned between a power supply voltage and an output end of the CMOS inverter,
         wherein the second signal represents an output signal outputted through the output end of the CMOS inverter,
      wherein the first and the second control section are sequentially enabled when the first signal is enabled, and
      wherein the power supply voltage is supplied to the output end when the second control section is enabled;
   a second pre-driver receiving a third signal so as to output a fourth signal in which a slew rate is controlled; and
   a pull-up transistor and a pull-down transistor connected in series between a power supply voltage and a ground voltage,
   wherein the pull-up transistor is turned on and/or off by the second signal, and the pull-down transistor is turned on and/or off by the fourth signal.

8. The output driver as claimed in claim 7, wherein the first control section comprises at least one resistance component and at least one transistor connected in series between the power supply voltage and the ground voltage, and the transistor of the first control section is turned on to enable the second control section while the first signal is enabled.

9. The output driver as claimed in claim 7, wherein a first and a second resistance component are connected between the pull-up transistor and the pull-down transistor.

10. An output driver for a semiconductor device, the output driver comprising:
a first pre-driver receiving a first signal so as to output a second signal in which a slew rate is controlled;
a second pre-driver receiving a third signal so as to output a fourth signal in which a slew rate is controlled, wherein the second pre-driver comprises:
a CMOS inverter for receiving the third signal,
a pulse generating circuit for receiving the third signal to output a pulse signal having a constant width,
a first control section for receiving the pulse signal outputted from the pulse generating circuit, and
a second control section which is turned on and/or off by a control signal outputted from the first control section,
wherein the second control section is positioned between an output end of the CMOS inverter and a ground voltage,
wherein the fourth signal represents an output signal outputted through the output end of the CMOS inverter,
wherein the first and the second control section are sequentially enabled by the pulse signal generated from the pulse generating circuit, and
wherein the ground voltage is supplied to the output end when the second control section is enabled;
a pull-up transistor and a pull-down transistor connected in series between a power supply voltage and a ground voltage,
wherein the pull-up transistor is turned on and/or off by the second signal, and the pull-down transistor is turned on and/or off by the fourth signal.

11. The output driver as claimed in claim 10, wherein the second control section is enabled only while the pulse signal is enabled.

12. The output driver as claimed in claim 10, wherein the first control section comprises at least one resistance component and at least one transistor connected in series between the power supply voltage and the ground voltage, and the transistor of the first control section is turned on to enable the second control section while the pulse signal is enabled.

13. The output driver as claimed in claim 12, wherein the CMOS inverter is positioned between the power supply voltage and the ground voltage, and a PMOS transistor of the CMOS inverter has a PVT variation property similar to that of the transistor of the first control section.

14. The output driver as claimed in claim 13, wherein the transistor of the first control section is a PMOS transistor and the second control section includes an NMOS transistor.

15. The output driver as claimed in claim 10, wherein a first and a second resistance component are connected between the pull-up transistor and the pull-down transistor.

16. An output driver for a semiconductor device, the output driver comprising:
a first pre-driver receiving a first signal so as to output a second signal in which a slew rate is controlled;
a second pre-driver receiving a third signal so as to output a fourth signal in which a slew rate is controlled, wherein the second pre-driver comprises:
a CMOS inverter for receiving the third signal,
a first control section for receiving the third signal, and
a second control section which is turned on and/or off by a control signal outputted from the first control section,
wherein the second control section is positioned between an output end of the CMOS inverter and a ground voltage,
wherein the fourth signal represents an output signal outputted through the output end of the CMOS inverter,
wherein the first and the second control section are sequentially enabled when the third signal is enabled, and
wherein the ground voltage is supplied to the output end when the second control section is enabled;
a pull-up transistor and a pull-down transistor connected in series between a power supply voltage and a ground voltage,
wherein the pull-up transistor is turned on and/or off by the second signal, and the pull-down transistor is turned on and/or off by the fourth signal.

17. The output driver as claimed in claim 16, wherein the first control section comprises at least one resistance component and at least one transistor connected in series between the power supply voltage and the ground voltage, and the transistor of the first control section is turned on to enable the second control section while the third signal is enabled.

18. The output driver as claimed in claim 16, wherein a first and a second resistance component are connected between the pull-up transistor and the pull-down transistor.

* * * * *